United States Patent
Edge et al.

(10) Patent No.: US 8,796,128 B2
(45) Date of Patent: Aug. 5, 2014

(54) DUAL METAL FILL AND DUAL THRESHOLD VOLTAGE FOR REPLACEMENT GATE METAL DEVICES

(75) Inventors: Lisa F. Edge, Albany, NY (US); Nathaniel Berliner, Albany, NY (US); James John Demarest, Albany, NY (US); Balasubramanian S. Haran, Albany, NY (US); Raymond J. Donohue, Selkirk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/367,419

(22) Filed: Feb. 7, 2012

(65) Prior Publication Data

US 2013/0200467 A1     Aug. 8, 2013

(51) Int. Cl.
*H01L 21/28* (2006.01)
*H01L 27/088* (2006.01)

(52) U.S. Cl.
USPC ...... 438/591; 438/592; 257/392; 257/E21.19; 257/E27.06

(58) Field of Classification Search
CPC .............. H01L 27/088; H01L 21/82345
USPC ................................. 438/199, 591
See application file for complete search history.

(56) References Cited

U.S. PATENT DOCUMENTS

| | | | |
|---|---|---|---|
| 6,410,376 B1 | 6/2002 | Ng et al. | |
| 7,045,428 B2 | 5/2006 | Brask et al. | |
| 7,148,548 B2 | 12/2006 | Doczy et al. | |
| 7,192,856 B2 | 3/2007 | Doczy et al. | |
| 8,048,810 B2 * | 11/2011 | Tsai et al. | 438/703 |
| 2002/0058374 A1 | 5/2002 | Kim et al. | |
| 2010/0052066 A1 * | 3/2010 | Yu et al. | 257/369 |
| 2010/0159684 A1 | 6/2010 | Chang et al. | |
| 2010/0164008 A1 * | 7/2010 | Mehrad et al. | 257/369 |
| 2011/0020994 A1 * | 1/2011 | Lin et al. | 438/287 |

* cited by examiner

*Primary Examiner* — Mark A Laurenzi
*Assistant Examiner* — Mounir Amer
(74) *Attorney, Agent, or Firm* — Yuanmin Cai; Howard M. Cohn

(57) ABSTRACT

A structure and method for forming a dual metal fill and dual threshold voltage for replacement gate metal devices is disclosed. A selective deposition process involving titanium and aluminum is used to allow formation of two adjacent transistors with different fill metals and different workfunction metals, enabling different threshold voltages in the adjacent transistors.

13 Claims, 8 Drawing Sheets

US 8,796,128 B2

DUAL METAL FILL AND DUAL THRESHOLD VOLTAGE FOR REPLACEMENT GATE METAL DEVICES

FIELD OF THE INVENTION

The present invention relates generally to semiconductor devices and more particularly to integrated circuits including metal gate MOS transistor devices and fabrication methods for making the same.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a gate electrode is energized to create an electric field in a channel region of a semiconductor body, by which electrons are allowed to travel through the channel between a source region and a drain region of the semiconductor body. The source and drain regions are typically formed by adding dopants to targeted regions on either side of the channel. A gate dielectric or gate oxide is formed over the channel, and a gate electrode or gate contact is formed over the gate dielectric. The gate dielectric and gate electrode layers are then patterned to form a gate structure overlying the channel region of the substrate.

In operation of the resulting MOS transistor, the threshold voltage (Vt) is the gate voltage value required to render the channel conductive by formation of an inversion layer at the surface of the semiconductor channel. The threshold voltage is dependent upon, among other things, the workfunction difference between the gate and the substrate materials. In various circuit designs, it is desirable to have transistors with different threshold voltages within the same IC (integrated circuit) chip.

The workfunction of a material is a measure of the energy required to move an electron in the material outside of a material atom from the Fermi level, and is usually expressed in electron volts (eV). For CMOS products, it is desirable to provide predictable, repeatable, and stable threshold voltages (Vt) for the NMOS and PMOS transistors. To establish Vt values, the workfunctions of the PMOS and NMOS gate contact and the corresponding channel materials are independently tuned or adjusted through gate and channel engineering, respectively.

The use of different workfunction metals may be used to tune threshold voltages. However, this technique often requires additional mask levels, resulting in higher complexity and cost for fabrication. Furthermore, residual work function metals on respective devices may cause unacceptable levels of yield and device variability. Therefore, it is desirable to have an improved method and structure for achieving multiple threshold voltages within a chip.

SUMMARY

In one embodiment, a method for forming two transistors having different threshold voltages is provided. The method comprises forming a first gate cavity in a first transistor and a second gate cavity in a second transistor, depositing a gate dielectric film in the gate cavity of the first and second transistors, depositing a first workfunction metal in the gate cavity of the first and second transistors, depositing a titanium layer in the gate cavity of the first and second transistors, removing the titanium layer from the gate cavity of the second transistor, depositing a first fill metal in the gate cavity of the first transistor, depositing a second workfunction metal in the gate cavity of the second transistor, depositing a second fill metal in the gate cavity of the second transistor, and planarizing the first and second transistors.

In another embodiment, a method for forming two transistors having different threshold voltages is provided. The method comprises forming a first gate cavity in a first transistor and a second gate cavity in a second transistor, depositing a gate dielectric film in the gate cavity of the first and second transistors, depositing a first workfunction metal in the gate cavity of the first and second transistors, depositing a titanium layer in the gate cavity of the first and second transistors, depositing a hardmask layer in the gate cavity of the first and second transistors, removing a portion of the hardmask layer from the gate cavity of the second transistor, removing the titanium layer from the gate cavity of the second transistor, removing the hardmask layer from the gate cavity of the first transistor, depositing a first fill metal in the gate cavity of the first transistor, depositing a second workfunction metal in the gate cavity of the second transistor, depositing a second fill metal in the gate cavity of the second transistor, and planarizing the first and second transistors.

In another embodiment, a semiconductor structure is provided. The semiconductor structure comprises a first field effect transistor comprising a first gate cavity, a second field effect transistor comprising a second gate cavity, a first fill metal disposed in the first gate cavity, and a second fill metal disposed in the second gate cavity.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 shows a semiconductor structure 100 at a starting point for fabrication of an embodiment of the present invention.

FIG. 2 shows a semiconductor structure at a subsequent point in the fabrication process where a gate dielectric film is deposited.

FIG. 3 shows a semiconductor structure at a subsequent point in the fabrication process where a first workfunction metal is deposited.

FIG. 4 shows a semiconductor structure at a subsequent point in the fabrication process where a titanium layer is deposited.

FIG. 5 shows a semiconductor structure at a subsequent point in the fabrication process where a hardmask layer is deposited.

FIG. 6 shows a semiconductor structure at a subsequent point in the fabrication process where a portion of the hardmask layer is removed.

FIG. 7 shows a semiconductor structure at a subsequent point in the fabrication process where a portion of the titanium layer is removed.

FIG. 8 shows a semiconductor structure at a subsequent point in the fabrication process where the remaining hardmask portion is removed.

FIG. 9 shows a semiconductor structure at a subsequent point in the fabrication process where a first fill metal is deposited.

FIG. 10 shows a semiconductor structure at a subsequent point in the fabrication process where a second workfunction metal is deposited.

FIG. 11 shows a semiconductor structure at a subsequent point in the fabrication process where a second fill metal is deposited.

Figure 12:
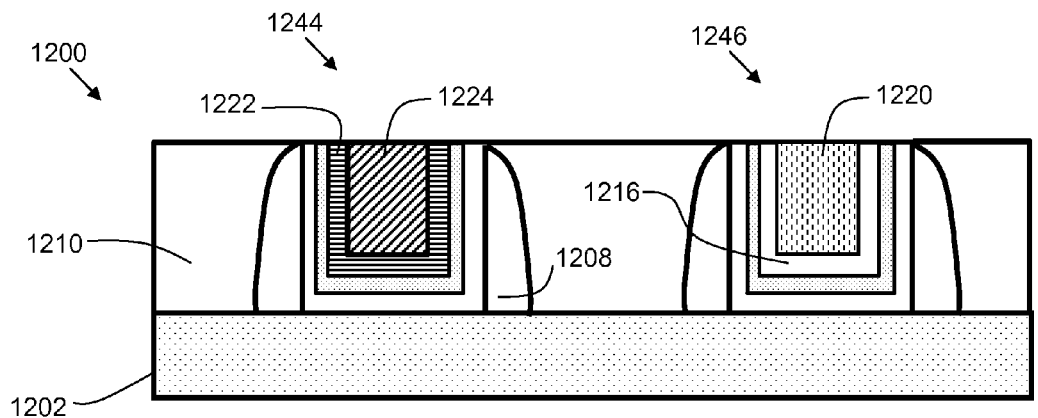

FIG. 12 shows a semiconductor structure at a subsequent point in the fabrication process after planarization.

Figure 13:
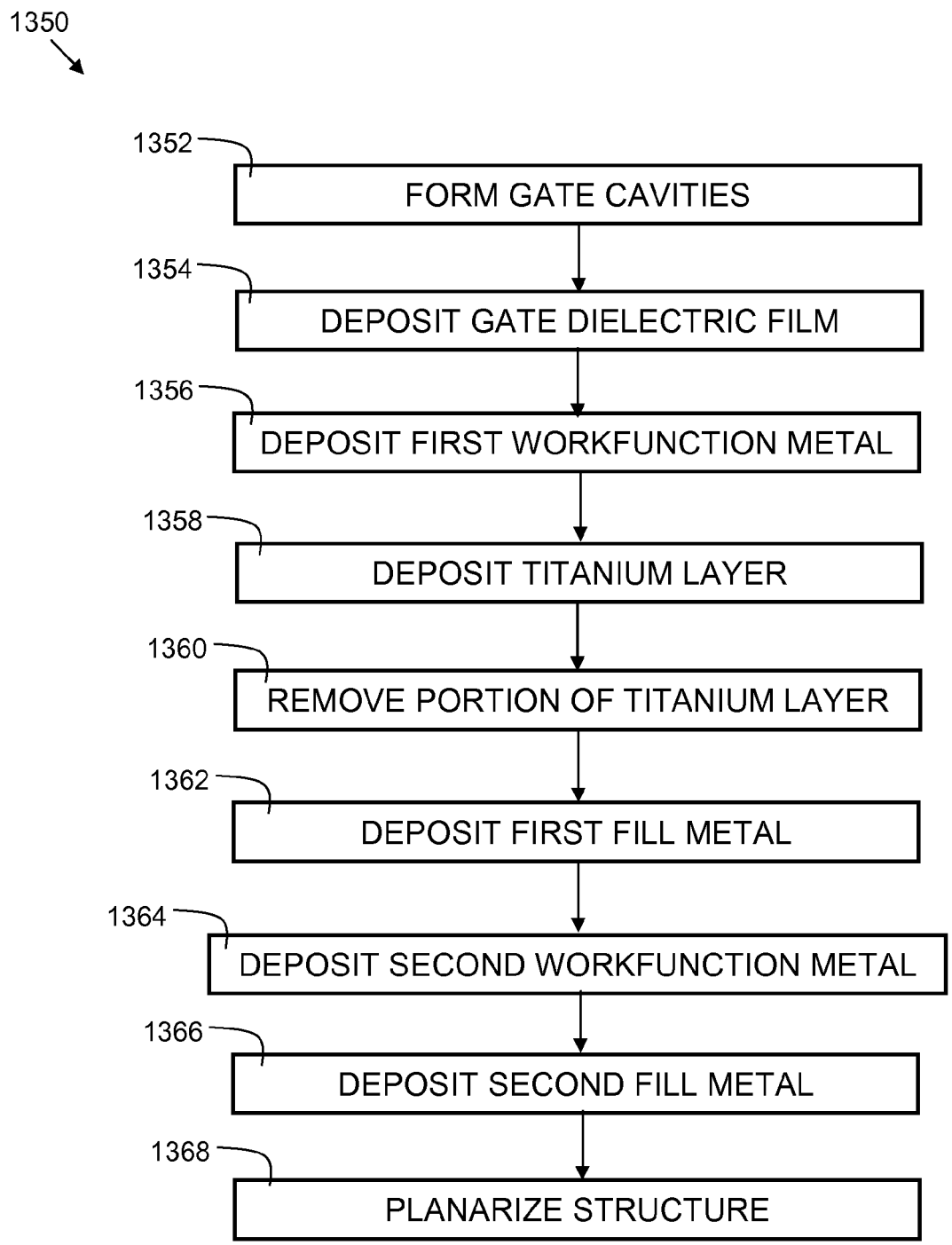

FIG. 13 shows a flowchart indicating process steps in accordance with an embodiment of the present invention.

Figure 14:
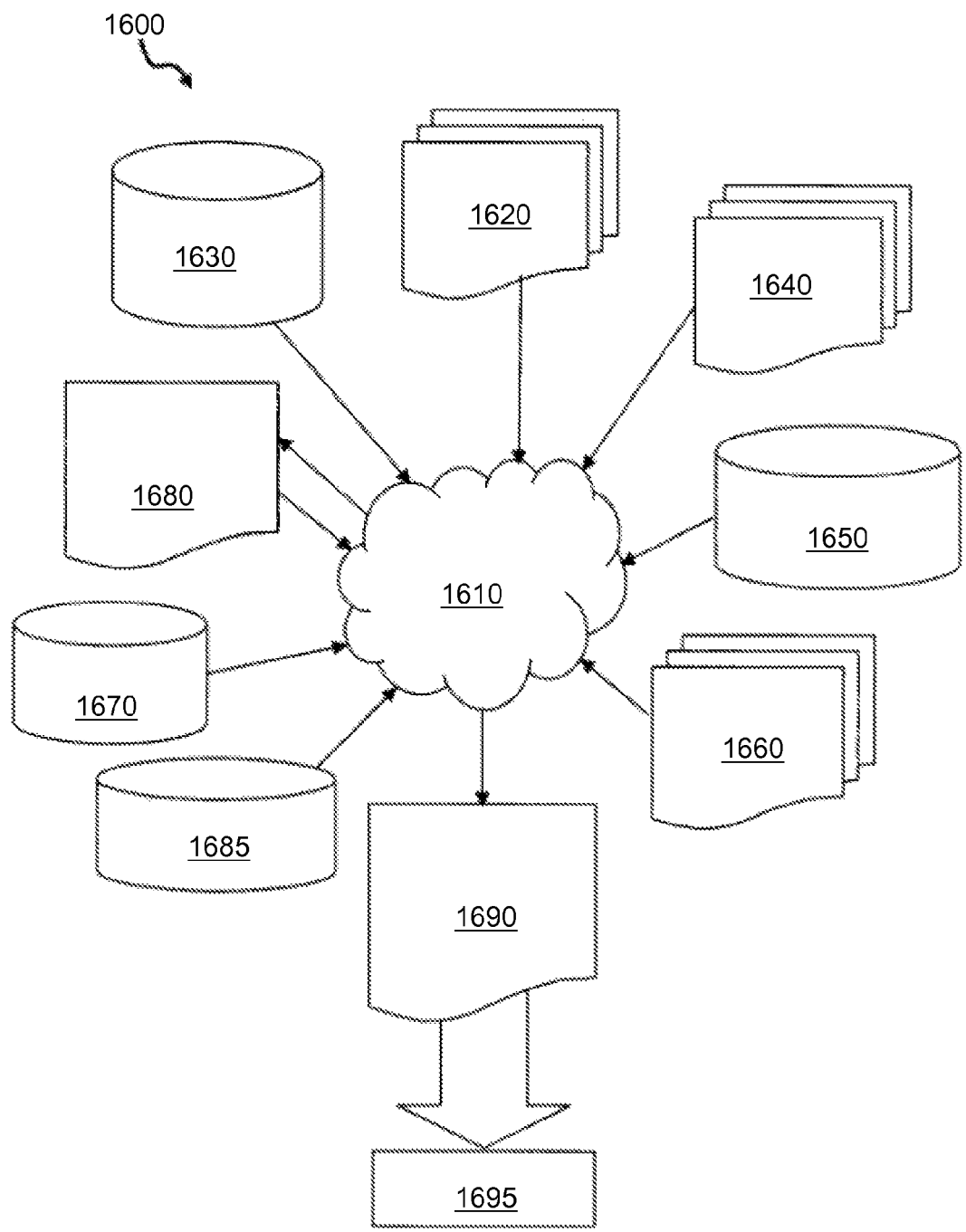

FIG. 14 shows a block diagram of an exemplary design flow.

DETAILED DESCRIPTION

Figure 1:
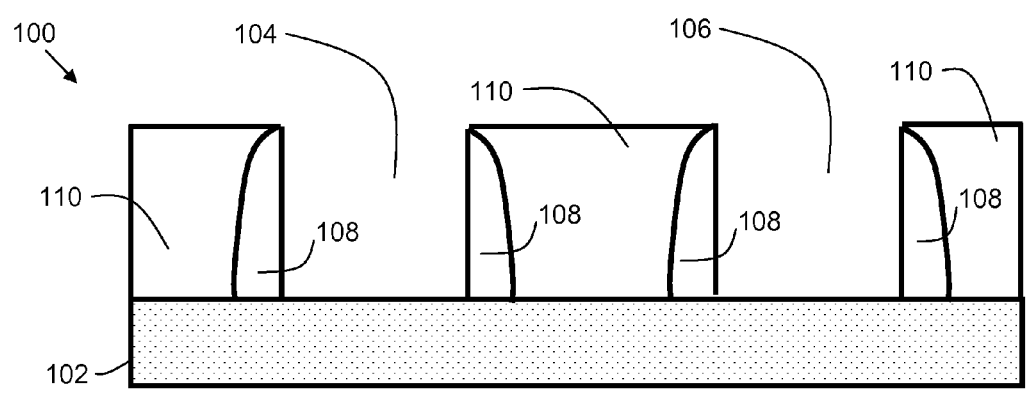

FIG. 1 shows a semiconductor structure at a starting point for fabrication of an embodiment of the present invention. A silicon layer 102 forms the bottom of the structure. Disposed on silicon layer 102 is dielectric layer 110. A first gate cavity 106 and second gate cavity 104 are formed within the dielectric layer 110. Spacers 108 form the interior walls of the gate cavity 104 and gate cavity 106. The spacers 108 may be comprised of nitride.

Figure 2:
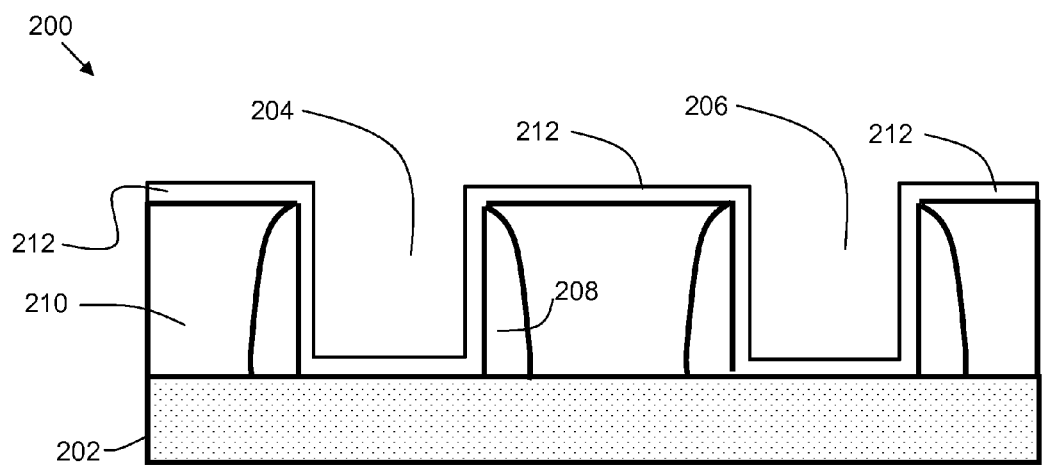

FIG. 2 shows a semiconductor structure 200 at a subsequent point in the fabrication process where gate dielectric film 212 is deposited in the first gate cavity 206 and second gate cavity 204. Most any suitable gate dielectric material can be used. In one embodiment, the gate dielectric film comprises one of hafnium oxide, silicon oxide, or a compound of the form HfSiOx. As stated previously, similar elements may be referred to by similar numbers in various figures of the drawing, in which case typically the last two significant digits may be the same, the most significant digit being the number of the drawing figure. Furthermore, for clarity, some reference numbers may be omitted in certain drawings. For example, spacer 208 of FIG. 2 is similar to spacer 108 of FIG. 1.

Figure 3:
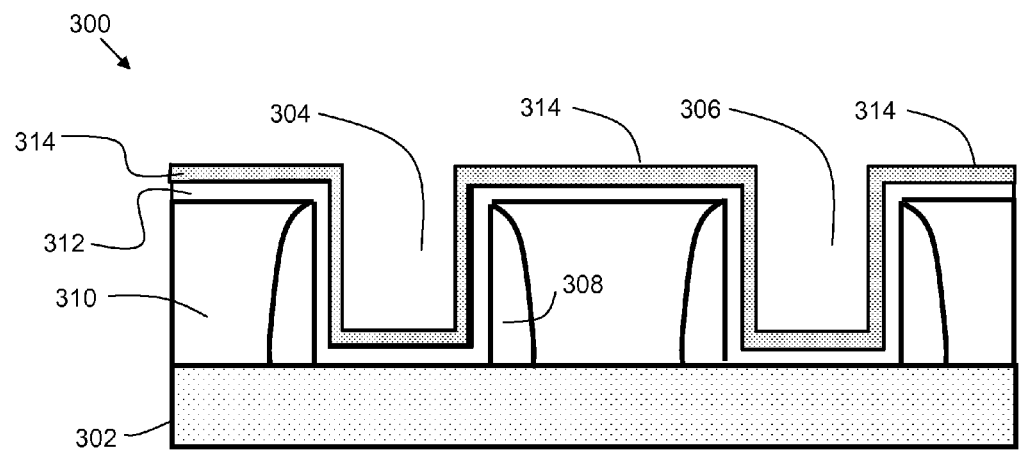

FIG. 3 shows a semiconductor structure 300 at a subsequent point in the fabrication process where a first workfunction metal 314 is deposited in the first gate cavity 306 and the second gate cavity 304. The first workfunction metal 314 may be deposited via atomic layer deposition. The first workfunction metal may be comprised of titanium nitride (TiN).

Figure 4:
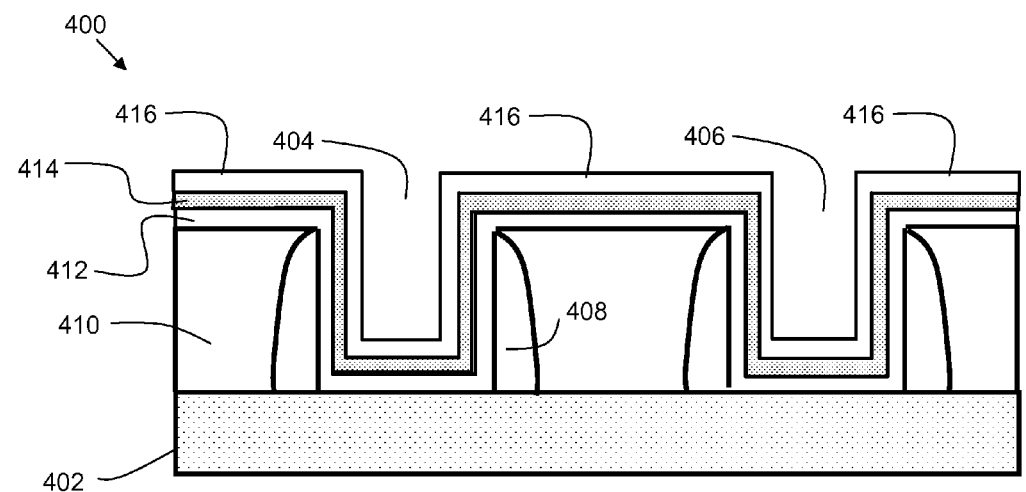

FIG. 4 shows a semiconductor structure 400 at a subsequent point in the fabrication process where a titanium layer 416 is deposited in the first gate cavity 406 and the second gate cavity 404. The titanium layer may be deposited via numerous methods, including, but not limited to, plasma-enhanced chemical vapor deposition (PECVD), chemical vapor deposition (CVD), and atomic layer deposition (ALD).

Figure 5:
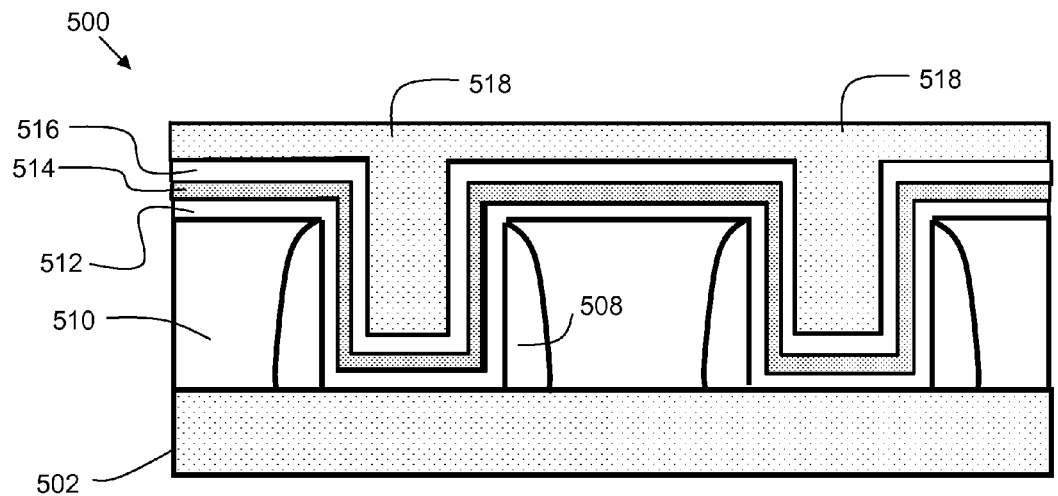

FIG. 5 shows a semiconductor structure 500 at a subsequent point in the fabrication process where a hardmask layer 518 is deposited onto the semiconductor structure 500, filling the two gate cavities (compare with 404 and 406 of FIG. 4).

Figure 6:
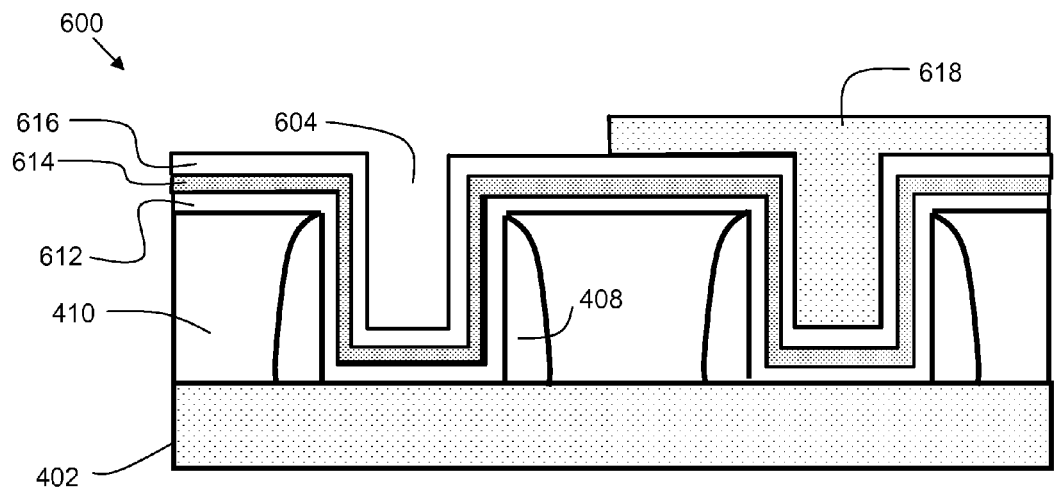

FIG. 6 shows a semiconductor structure 600 at a subsequent point in the fabrication process where a portion of the hardmask layer is removed, exposing gate cavity 604, whereas a portion of the hardmask layer 618 remains, and fills the other gate cavity. Industry-standard lithographic and patterning methods may be used in the application and removal of the hardmask layer.

Figure 7:
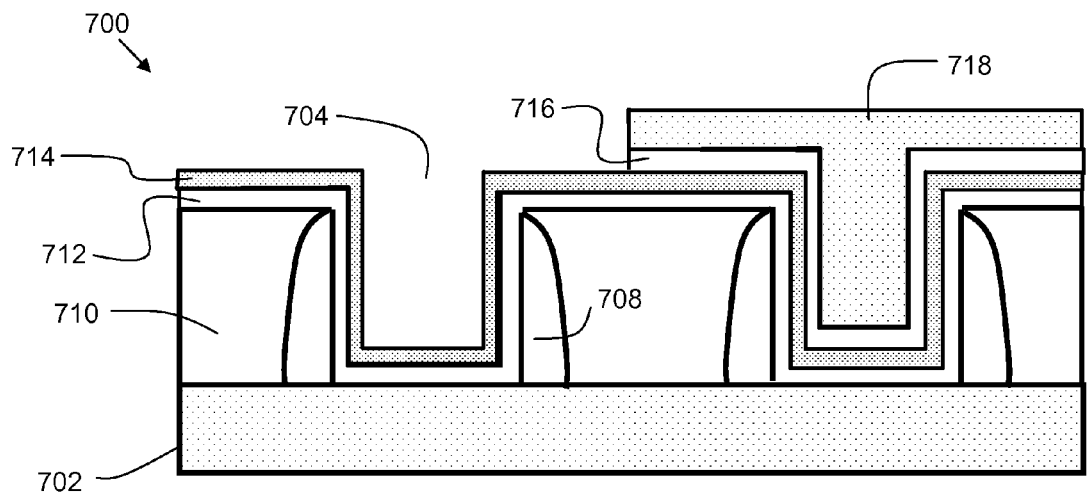

FIG. 7 shows a semiconductor structure 700 at a subsequent point in the fabrication process where a portion of the titanium layer is removed from gate cavity 704, whereas a portion of the titanium layer 716 remains, and is disposed within the other gate cavity. The removed portion of the titanium layer may be removed from gate cavity 704 via a sputter etch.

Figure 8:
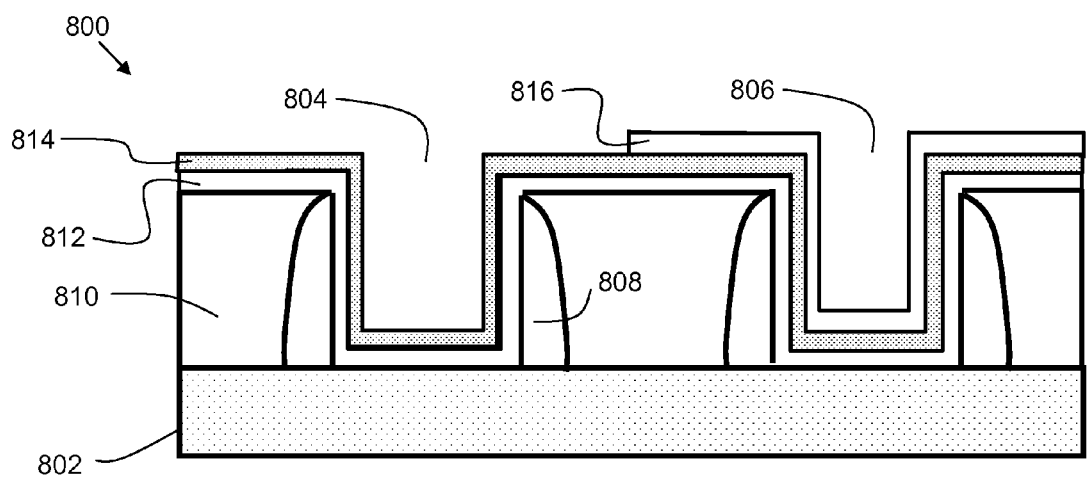

FIG. 8 shows a semiconductor structure 800 at a subsequent point in the fabrication process where the remaining hardmask portion (see 718 of FIG. 7) is removed. At this point gate cavity 804 and gate cavity 806 are both exposed. Gate cavity 806 has titanium layer 816 disposed within it, whereas gate cavity 804 does not have a corresponding titanium layer.

Figure 9:
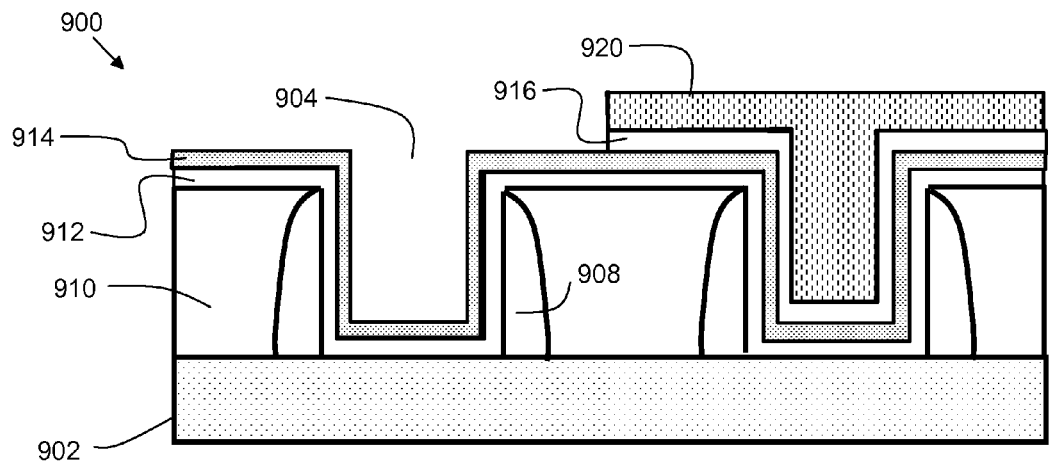

FIG. 9 shows a semiconductor structure 900 at a subsequent point in the fabrication process where a first fill metal 920 is deposited. The first fill metal may be aluminum, and may be deposited via methods including, but not limited to, chemical vapor deposition (CVD), plasma-enhanced chemical vapor deposition (PECVD), and atomic layer deposition (ALD). The aluminum has selective deposition properties, and only deposits on titanium layer 916. Hence, aluminum does not deposit in gate cavity 904. The titanium layer 916 can serve two purposes. In addition to enabling the selective deposition, it can also contribute to the threshold voltage of the transistor.

Figure 10:
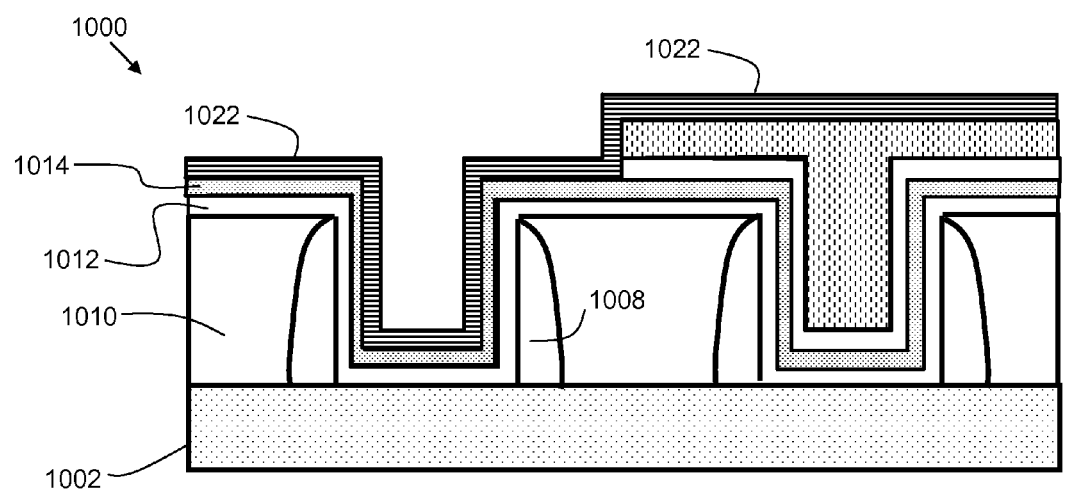

FIG. 10 shows a semiconductor structure 1000 at a subsequent point in the fabrication process where a second workfunction metal 1022 is deposited. In one embodiment, the second workfunction metal 1022 is comprised of titanium aluminum nitride. In another embodiment, the second workfunction metal 1022 is comprised of tantalum carbide.

Figure 11:
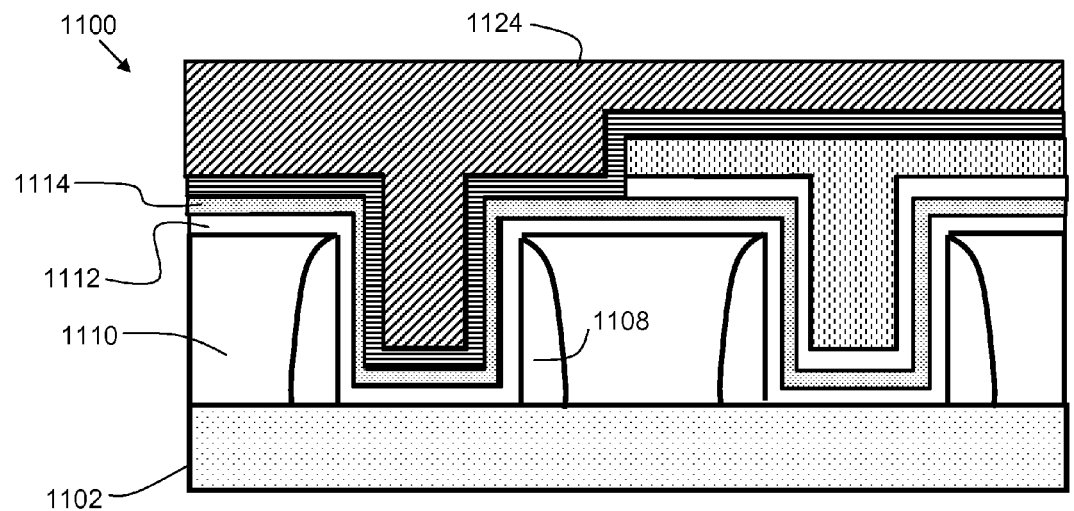

FIG. 11 shows a semiconductor structure 1100 at a subsequent point in the fabrication process where a second fill metal 1124 is deposited. In one embodiment, the second fill metal 1124 is comprised of tungsten. In other embodiments, the second fill metal 1124 may be comprised a material including, but not limited to, cobalt, molybdenum, ruthenium, nickel, tungsten, or combinations thereof.

FIG. 12 shows a semiconductor structure 1200 in accordance with an embodiment of the present invention after a planarization step. The planarization may be performed via a chemical mechanical polish (CMP). From this point forward, industry-standard semiconductor fabrication techniques may be used to complete the fabrication of transistor 1244 and transistor 1246. Transistor 1244 and transistor 1246 have different fill metals. Transistor 1246 has fill metal 1220 which may be comprised of aluminum. Transistor 1244 has fill metal 1224 which may be comprised of tungsten. Transistor 1246 has a titanium layer 1216 disposed under fill metal 1220, whereas transistor 1244 does not have a corresponding titanium layer disposed under fill metal 1224.

Furthermore, transistor 1244 has a second workfunction metal 1222 disposed under fill metal 1224, whereas transistor 1246 does not have a corresponding second workfunction metal disposed under fill metal 1220. The workfunction metals used in transistor 1244 and transistor 1246 may include, but are not limited to, pure metals, nitrides, carbides, and combinations thereof. Such workfunction metals may include, but are not limited to, TaC, TiAl, TiAlN, WN, Ti, Ta, TaN, TaAlC, and TaAlN.

Since the threshold voltage of a transistor is affected by both workfunction metals and fill metals, the ability to fabricate transistors on the same chip with different fill metals and workfunction metals allows for fabrication of transistors on the same chip with different threshold voltages. For design purposes, it is often desirable to have transistors with different threshold voltages on the same chip. Hence, embodiments of the present invention provide a way to achieve this goal without the disadvantages of additional masks or yield-impacting techniques that leave residual metals, which results in large threshold voltage variation amongst fabricated devices. Furthermore, while the example disclosed illustrated use of an embodiment of the invention with a planar technology such as ETSOI (extremely thin silicon-on-insulator), embodiments of the present invention are suitable for other device types, such as "3D" structures such as FinFETs.

FIG. 13 shows a flowchart 1350 indicating process steps in accordance with an embodiment of the present invention. In process step 1352, gate cavities are formed (see 104 and 106 of FIG. 1). In process step 1354, a gate dielectric film is deposited (see 212 of FIG. 2). In process step 1356, a first workfunction metal is deposited (see 314 of FIG. 3). In process step 1358, a titanium layer is deposited (see 416 of FIG. 4). In process step 1360, a portion of the titanium layer is removed (see 716 of FIG. 7). In process step 1362, a first fill metal is deposited (see 920 of FIG. 9). In process step 1364, a second workfunction metal is deposited (see 1022 of FIG. 10). In process step 1366, a second fill metal is deposited (see 1124 of FIG. 11). In process step 1368, the structure is planarized (see 1200 of FIG. 12).

FIG. 14 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 1-13. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 1-13. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 1-13 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 1-13, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-13. Design structure 1690 may then proceed to a stage 1695 where, for example, design structure 1690: proceeds to tape-out, is released to manufacturing, is released to a mask house, is sent to another design house, is sent back to the customer, etc.

Embodiments of the present invention utilize a selective deposition process involving titanium and aluminum to allow formation of two adjacent transistors with different fill metals and different workfunction metals, enabling different threshold voltages in the adjacent transistors.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for forming two transistors having different threshold voltages comprising:
    forming a first gate cavity in a first transistor and a second gate cavity in a second transistor;
    depositing a gate dielectric film in the first gate cavity and the second gate cavity;
    depositing a first workfunction metal in the first gate cavity and the second gate cavity;
    depositing a titanium layer in the first gate cavity and the second gate cavity;
    removing the titanium layer from the second gate cavity, thereby leaving a remaining portion of the titanium layer disposed in the first gate cavity;
    depositing a first fill metal of aluminum on the remaining portion of the titanium layer via a selective deposition process without depositing a mask on the second gate cavity, wherein the first fill metal of aluminum is not deposited above the second gate cavity;
    depositing a second workfunction metal in the second gate cavity;
    depositing a second fill metal in the second gate cavity; and
    planarizing the first and second transistors.

2. The method of claim 1, wherein depositing a first fill metal comprises depositing the first fill metal only on the remaining portion of the titanium and not depositing the first fill metal on the exposed first workfunction metal in the second gate cavity.

3. The method of claim 1, wherein depositing a gate dielectric film comprises depositing hafnium oxide.

4. The method of claim 1, wherein depositing a first workfunction metal comprises depositing titanium nitride.

5. The method of claim 1, wherein depositing a first workfunction metal is performed via atomic layer deposition.

6. The method of claim 1, wherein depositing a titanium layer is performed by plasma vapor deposition.

7. The method of claim 1, wherein removing the titanium layer from the second gate cavity is performed via a sputter etch.

8. The method of claim 1, wherein depositing a second workfunction metal comprises depositing titanium aluminum nitride.

9. The method of claim 1, wherein depositing a second workfunction metal comprises depositing tantalum carbide.

10. The method of claim 1, wherein depositing a second fill metal in the second gate cavity comprises depositing tungsten.

11. The method of claim 1, wherein depositing a second fill metal in the second gate cavity comprises depositing a material selected from the group consisting of cobalt, molybdenum, ruthenium, and nickel.

12. A method for forming two transistors having different threshold voltages comprising:
    forming a first gate cavity in a first transistor and a second gate cavity in a second transistor;
    depositing a gate dielectric film in the first gate cavity and the second gate cavity;
    depositing a first workfunction metal in the first gate cavity and the second gate cavity;
    depositing a titanium layer in the first gate cavity and the second gate cavity;
    depositing a hardmask layer in the first gate cavity and the second gate cavity;
    removing a portion of the hardmask layer from the second gate cavity;
    removing the titanium layer from the second gate cavity, thereby leaving a remaining portion of the titanium layer disposed in the first gate cavity;
    removing the hardmask layer from the first gate cavity;
    depositing a first fill metal comprised of aluminum on the remaining portion of the titanium layer via a selective deposition process without depositing a mask on the second gate cavity, wherein the first fill metal of aluminum is not deposited above the second gate cavity;
    depositing a second workfunction metal in the second gate cavity;
    depositing a second fill metal in the second gate cavity; and
    planarizing the first and second transistors.

13. The method of claim 12, wherein depositing a first fill metal comprises depositing aluminum.

\* \* \* \* \*